United States Patent
Ruiter et al.

(10) Patent No.: US 6,365,949 B1
(45) Date of Patent: Apr. 2, 2002

(54) SUBSTRATE HAVING A UNIDIRECTIONAL CONDUCTIVITY PERPENDICULAR TO ITS SURFACE, DEVICES COMPRISING SUCH A SUBSTRATE AND METHODS FOR MANUFACTURING SUCH A SUBSTRATE

(75) Inventors: Jacobus Christiaan Gerardus Maria Ruiter, Zoetermeer; Erik Maarten Terlouw, Amsterdam; Georges Hadziioannou, Peize; Hendrik-Jan Brouwer, Groningen, all of (NL)

(73) Assignee: Zetfolie B.V., Leidschendam (NL)

( * ) Notice: Subject to any disclaimer, the term of this patent is extended or adjusted under 35 U.S.C. 154(b) by 0 days.

(21) Appl. No.: 09/155,050

(22) PCT Filed: Jun. 12, 1998

(86) PCT No.: PCT/NL98/00341

§ 371 Date: Sep. 23, 1998

§ 102(e) Date: Sep. 23, 1998

(87) PCT Pub. No.: WO98/57226

PCT Pub. Date: Dec. 17, 1998

(30) Foreign Application Priority Data

Jun. 12, 1997 (NL) .............................................. 1006302

(51) Int. Cl.⁷ .............................................. H01L 27/14
(52) U.S. Cl. .......................... 257/431; 438/30; 438/57; 257/10
(58) Field of Search .............................. 438/30, 34, 35, 438/57; 257/10, 431, 432; 528/215, 210

(56) References Cited

U.S. PATENT DOCUMENTS

| | | | |
|---|---|---|---|
| 4,613,351 A | | 9/1986 | Spohr |
| 5,213,715 A | | 5/1993 | Patterson et al. |
| 5,229,635 A | | 7/1993 | Bessolo et al. |
| 5,272,217 A | | 12/1993 | Miller et al. |
| 5,438,223 A | | 8/1995 | Higashi et al. |
| 5,556,706 A | | 9/1996 | Wakita et al. |
| 5,626,795 A | * | 5/1997 | Smith et al. ................. 252/500 |
| 5,693,962 A | * | 12/1997 | Shi et al. ....................... 257/89 |
| 5,801,796 A | * | 9/1998 | Lowe ........................... 349/73 |
| 5,910,385 A | * | 6/1999 | Gardner et al. ............... 430/62 |
| 5,976,284 A | * | 11/1999 | Calvert et al. ................ 156/51 |
| 6,045,977 A | * | 4/2000 | Chandross et al. ......... 430/311 |

FOREIGN PATENT DOCUMENTS

| | | | |
|---|---|---|---|
| EP | 478368 | * | 1/1992 |
| JP | 57-111366 | | 7/1982 |
| JP | 63-271417 | | 11/1988 |
| JP | 4-196016 | | 7/1992 |
| JP | 5-11265 | | 1/1993 |
| JP | 8-7658 | | 1/1996 |
| JP | 8-122810 | | 5/1996 |
| JP | 8-143677 | | 6/1996 |
| WO | WO 96/04585 | | 2/1996 |

OTHER PUBLICATIONS

B.P. Piggin et al., "Diagonal Fibre Substrate", p. 2045, Technical Disclosure Bulletin, vol. 21, No. 5, Oct. 1978.

* cited by examiner

*Primary Examiner*—Caridad Everhart
(74) *Attorney, Agent, or Firm*—Young & Thompson

(57) ABSTRACT

Substrate (7; 7'; 10) and devices including such a substrate, the substrate having a first surface and a second surface extending substantially in parallel to the first surface, the substrate being of a material of a first conductivity and provided with a plurality of electrically conducting channels (21) which are extending exclusively in a direction perpendicular to the first and second surfaces, said channels having a second conductivity substantially larger than the first conductivity, the substrate being provided with at least one electrode (42) on either one of the first and second surfaces, contacting at least one of said channels, the at least one electrode (42) having a predetermined minimum dimension (D) in a contact area (A) with the substrate, and mutual distances between adjacent ones of the plurality of channels (21) being smaller than said minimum dimension of said at least one electrode (42).

15 Claims, 7 Drawing Sheets

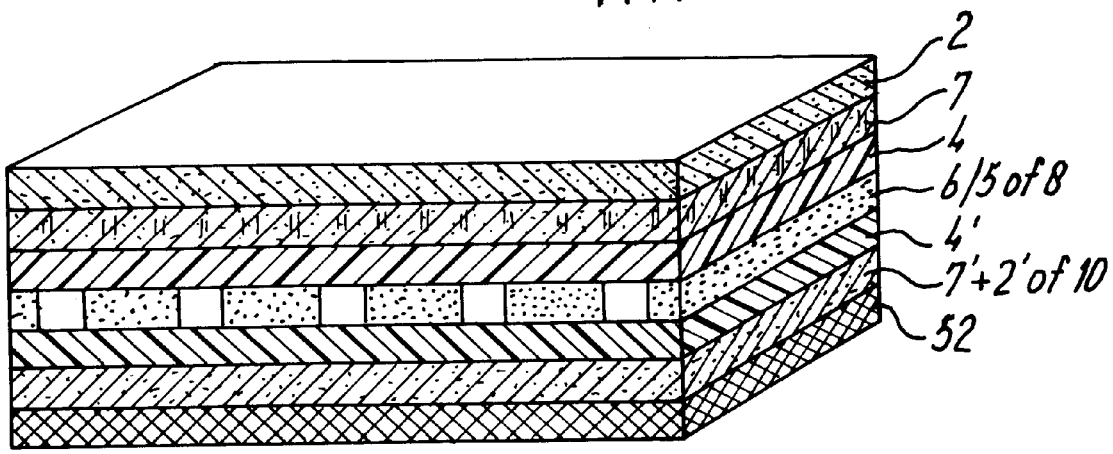

SUBSTRATE HAVING A UNIDIRECTIONAL CONDUCTIVITY PERPENDICULAR TO ITS SURFACE, DEVICES COMPRISING SUCH A SUBSTRATE AND METHODS FOR MANUFACTURING SUCH A SUBSTRATE

The present invention relates to a substrate having a first surface and a second surface extending substantially in parallel to the first surface, the substrate being of a material of a first conductivity and provided with a plurality of electrically conducting channels which are extending exclusively in a direction perpendicular to the first and second surfaces, said channels having a second conductivity substantially larger than the first conductivity, the substrate being provided with at least one electrode on either one of the first and second surfaces, contacting at least one of said channels.

Such a device is known from WO-A-96/04585 which discloses an LCD having an active matrix of electronic components, like thin film transistors and thin film diodes, deposited on the outside surface of the LCD cell substrate.

It is to be observed that for the purpose of the present invention, the expression "exclusively in a direction perpendicular to . . . " is intended to include deviations inherently due to the production process used. Moreover, the first and second conductivities differ at least by a factor of 1000, but preferably much more, e.g. more than a factor $10^5$.

U.S. Pat. No. 4,613,351 describes a glass material in which parallel conducting tracks are applied in a predetermined direction. The tracks are intended to deflect and detect electromagnetic radiation having a wavelength between less than 0.1 $\mu$m and 1 mm.

U.S. Pat. No. 5,438,223 describes a kind of rivet system for interfacial connection of an insulating layer with an electrically conducting material. The electrically conducting parts are applied in holes transversely through the layer and then thermally riveted.

Japanese Patent Application JP-A-081143677 describes the production of a sheet by depositing gaseous material on an electrode. The electrical conductivity in a direction perpendicular to the surface of the sheet is much greater than the electrical conductivity in a direction parallel to the surface of the sheet. However, the conductivity in the direction perpendicular to the surface is in the order of $10^{-6}$ S/cm, which is very low and in the semiconductor range.

U.S. Pat. No. 5,272,217 describes the use of anisotropic polymers in a sheet. The conductivity parallel to the surface of the sheet of the polymer is much higher than the conductivity in a direction perpendicular to the surface of the sheet. The tetrathiotetracene complex is mentioned as one of the polymers used. Use is made of a "stack orientation" in which elements of very small dimensions are grouped head-to-tail.

U.S. Pat. No. 5,556,706 also describes particles of very small dimensions which are oriented head-to-tail in a direction parallel to the surface of a polymer sheet. The sheet is produced by depositing a gaseous material on an electrode. Here, again, there is a greater conduction in a direction parallel to the surface of the sheet than in a direction perpendicular thereto after production.

U.S. Pat. No. 5,229,635 describes a device and a method of orienting very small elements head-to-tail under the influence of an electrical field. Said patent specification is aimed at achieving an electrical conductivity in a predetermined direction parallel to the surface of the sheet. Incident light can be converted into electrical power with the sheet.

Japanese Patent Application 08/007658 describes an adhesive film which is provided with small conducting particles. Prior to use, the film is non-conducting because the conducting particles are not in contact with one another. The film is used to make a connection between the terminal pins of an IC and a substrate. Because the terminal pins of the IC are pressed firmly in the direction of the substrate, electrically conducting connections are produced between the terminal pins of the IC and the conducting particles in the film. As a result of pressing the terminal pins firm enough against the substrate, a conducting connection is produced between the terminal pins and desired electrically conducting tracks on the substrate. At those points where there are no IC terminal pins, the film remains non-conducting. Similar adhesive films are disclosed in U.S. Pat. No. 5,213,715 and Japanese Patent Application 57/111366 and 05/011265.

FIG. 1 shows in a very diagrammatic way the structure of a conventional LCD. The centremost of the three layers shown, indicated by the reference numeral 3, is the optical layer. This is surrounded on either side by two controlling layers 2, 2'. The controlling layers 2, 2' must be situated as closely as possible to the optical layer 3. In essence, there are two types of optical layers: liquid crystals, which orient themselves under the influence of an electrical field, and light-emitting layers, which emit light under the influence of an electrical current. Light-emitting layers dissipate power during operation, while liquid crystals dissipate energy solely for the purpose of orientation. Light-emitting materials are, for example, LEDs, laser diodes and electroluminescent materials.

Where polarized light is employed, polarization filters are in practice also needed. Said polarization filters and any other correction filters are not described in more detail here because they are not of importance for the present invention. However, where necessary they can in fact be used.

The optical layer 3 generally comprises three layers 4, 6, 4', as shown in FIG. 2. In addition, supporting layers 1, 1' are situated on the outside of the controlling layer 2, 2'. The centrally situated layer 6 comprises a liquid-crystal layer in which spacers 5 are situated at regular or irregular distances in order to keep the two insulating layers 4, 4' at a predetermined distance from one another. The primary function of the layers 4, 4' is to facilitate the orientation of the liquid crystals in the same direction. Furthermore, they are important in preventing the liquid crystals from being contaminated by migration of ions, such as tin and indium, out of the conductor patterns 2, 2'. Finally, the layers 4, 4' provide an insulating function.

The controlling layers 2, 2' comprise, for example, transparent material which contains a pattern of, for example, parallel, likewise transparent conductors. The parallel conductors in the controlling layer 2 are then situated, for example, perpendicular to the transparent, parallel conductors in the controlling layer 2'. Using such patterns, electrical fields can be generated at desired positions transversely or at an angle to the liquid crystal 6 layer, as a result of which the crystals in the liquid crystal layer 6 orient themselves. At the points where this occurs, the liquid crystal layer 6 becomes impenetrable to incident light.

In the conventional structure of an LCD shown in FIG. 2, the controlling layers 2, 2' are situated inside the supporting layers 1, 1'. Such LCDs can be transported only when the supporting layers have been applied. Without the supporting layers 1, 1', the LCD structure would be too vulnerable. As a result, it is impossible to make changes and/or corrections in the controlling layers 2, 2' after the manufacture of the LCD.

In addition, before the controlling layers 2, 2' have been applied, it is impossible to carry out checks on the correct operation of the liquid crystal layer 6.

Moreover the production yield of LCDs according to the known structure is low. A high percentage, sometimes more than 70%, does not meet the requirements and cannot be sold.

A standard method of orienting the material of the insulating layers 4, 4' horizontally is the so-called "rubbing" or frictional treatment. However, because the controlling layers 2, 2' in the conventional arrangement are applied next to the insulating layers 4, 4', there is a high risk of damage to said controlling layer 2, 2' during the rubbing. This arises both as a result of discharge as a consequence of static electricity and as a result of other types of damage.

The controlling layers 2, 2' are generally composed of indium/tin oxide structures and/or thin-film transistors and/or metal/insulation/metal structures and/or diodes. Polyimide is often used as insulating layer 4, 4'. High temperatures are used during the process for applying the last-mentioned layer, which is an additional hazard for the satisfactory operation of the thin-film transistors, the metal/insulation/metal structures and/or diodes.

The devices disclosed in WO-A-96/04585 referred to above and which are provided with active matrices on the outside surfaces of the LCD cell substrates at least partly solve these problems related to the conventional LCD design. However, still a pattern of individual, transparent electrodes is applied on the inside surface of the LCD cell substrate according to this prior art document. These internal electrodes are connected to the active matrix on the outside of the surface by means of thin conductive leads. Each internal electrode is connected to one single thin conductive lead, whereas each of the thin conductive leads is also connected to one of a series of conductive leads applied to the outside surface of the LCD cell substrate and contacting the active matrix.

No manufacturing details with respect to producing the thin conductive leads in the LCD substrate are given. No other production methods than multi-mask steps vacuum technology in general is referred to. Therefore, the suggested method of producing the devices of WO-A-96104585 necessarily includes extremely difficult alignment steps for properly aligning the thin conductive leads through the LCD substrate with the internal transparent electrodes and the external conductive leads. Especially, it seems difficult if not impossible to transport unfinished LCD's to a customer without having an active matrix on the outside surface of the LCD substrate and leave it to the customer to apply the active matrix on the outside surface of the LCD substrate in correspondence with his needs. Without undue costs, costumers will not be able to apply their desired active matrix in proper alignment with the thin conductive leads through the substrate.

The primary object of the present invention is to provide a substrate with at least one electrode, the substrate being provided with electrical leads perpendicular to its surface and allowing electrical connection between at least one electrical lead and the electrode without complex alignment procedures.

For this purpose, a substrate of the type mentioned at the outset is characterised in that the at least one electrode has a predetermined minimum dimension in a contact area with the substrate, and that mutual distances between adjacent ones of the plurality of channels are smaller than said minimum dimension of said at least one electrode. Then, no matter where the at least one electrode is contacting the substrate it will always contact at least one of the channels. This greatly reduces alignment problems.

Preferably, the mutual distances are at most two times smaller than the minimum dimension of at least one electrode.

Even more preferably, the mutual distances are at most ten times smaller than the minimum dimension of the at least one electrode.

The plurality of electrically conducting channels may either be distributed in accordance with a regular pattern or randomly through the substrate.

In one embodiment, the mutual distances are smaller than 3.5 $\mu$m.

A further object of the invention is to provide a device for displaying information, for example an LCD, which can be transported to customers without the pattern of controlling layers necessarily already having been applied on the substrate and still providing customers with the possibility to apply the pattern of controlling layers on locations desired by them without undue costs and complexity.

A still further object of the invention is to increase the yield of the production of such devices.

To that end, the invention also relates to a device for displaying information, comprising at least:

a first layer which extends in one plane and is composed of a material whose optical properties vary under the influence of an external electrical control system in such a way that either the transparency of portions selected with the electrical control system of the first layer for light incident thereon varies or portions selected with the electrical control system of the first layer emit light;

a second and a third layer which extend substantially parallel to the plane, are situated on either side of the first layer and impart to the device a certain desired rigidity, at least one of the second and third layers being provided with at least one electrode and with electrically conducting channels which are conductive exclusively in a direction perpendicular to the plane, said at least one electrode electrically contacting at least one of said channels, characterized in that said at least one electrode has a predetermined minimum dimension in the contact area with said at least one of the second and third layers, and that mutual distances between adjacent ones of the plurality of channels are smaller than said minimum dimension of said at least one electrode.

Such a structure has sufficient rigidity to be able to be transported to customers without the ultimately necessary conductor patterns having already been applied. The conductor patterns can be applied by the customer himself on the outside of the second and/or third layer. The conducting channels in the second and/or third layer then ensure that an electrical voltage and/or current whose positions are defined by the pattern of conductors is transmitted to the first layer. The narrower the small channels and the closer together they are situated, the greater the resolution will be.

A further advantage is that, if the pattern of conductors is not correctly applied to the structure thus defined, said pattern can easily be removed without the device as a whole having to be discarded. After removal, the pattern can be applied again. This will appreciably increase the production yield.

The device according to the invention may be a component of an LCD, in which the first layer is a liquid-crystal layer, provided with spacers and in which there is situated between said one of the said second and third layers and the first layer a fourth layer which is made of an electrically insulating material. Said liquid-crystal layer may be of the nematic or smectic type, depending on the desired use. Nematic liquid-crystal layers require a continuous drive in order to be able to have a memory function. This requires suitable electronics, comprising, for example, metal/insulator/metal structures, thin-film transistors, diodes and conductors. Smectic liquid-crystal layers have a spontaneous memory function.

As an alternative, such an LCD may have a polymer dispersed liquid-crystal layer as first layer, a fourth layer which is made of an electrically insulating material being situated between said one of the second and third layers and said first layer.

As a further alternative, the device according to the invention can be designed so that the first layer emits light under the influence of an electric current.

The device according to the main claim of this invention defined in this way and according to the variants mentioned thereof then forms an unfinished plate of material which can subsequently be provided by the user with the necessary application-dependent conductor tracks and electronics. Such an unfinished device can therefore be made as a standard and not in an application-dependent way. This increases the flexibility of the possible applications.

In some applications, not only said one of the second and third layers, but also the other, will have a pattern of electrical conductors which is such that the electrical conductivity of the conductors is directed exclusively in a direction perpendicular to the plane.

In one of the embodiments of the device according to the invention, there is applied to said one of the said second and third layers a photoconducting layer, to the outside of which a transparent electrically conducting layer has been applied. Such a device can be used as electronic paper.

In the case of the device last mentioned, a light source, for example a laser, can be provided to generate a light beam for exposing predetermined locations in the photoconducting layer. Such a device forms a laser-beam display.

The device defined above which is provided with a photoconducting layer to which a transparent, electrically conducting layer has been applied can be used with a laser for manufacturing a mask for photolithographic purposes. The advantage of such a mask is that the locations which are or are not transparent to light can always be defined again without altering the position of the device. Such a mask can therefore advantageously be used in photolithographic processes, because not moving the mask benefits the accuracy.

The device according to the invention can easily be provided with colours on one of the surfaces by applying a photosensitive layer to the side of the device at which the other of the second and third layers is situated. The locations at which the layer has to remain as a coloured layer and those at which it has to be removed can then easily be defined with the aid of exposure procedures and chemical development procedures.

Claims 22 to 26 inclusive define methods for manufacturing a layer of material which extends in one plane and is provided with a pattern of electrical conductors extending exclusively in a direction perpendicular to the surface.

The present invention will be explained in greater detail below by reference to some figures which are intended to illustrate the invention and not to limit the scope of its protection.

FIG. 7 shows a device according to the invention to which a coloured layer has been applied;

Figure 8A:
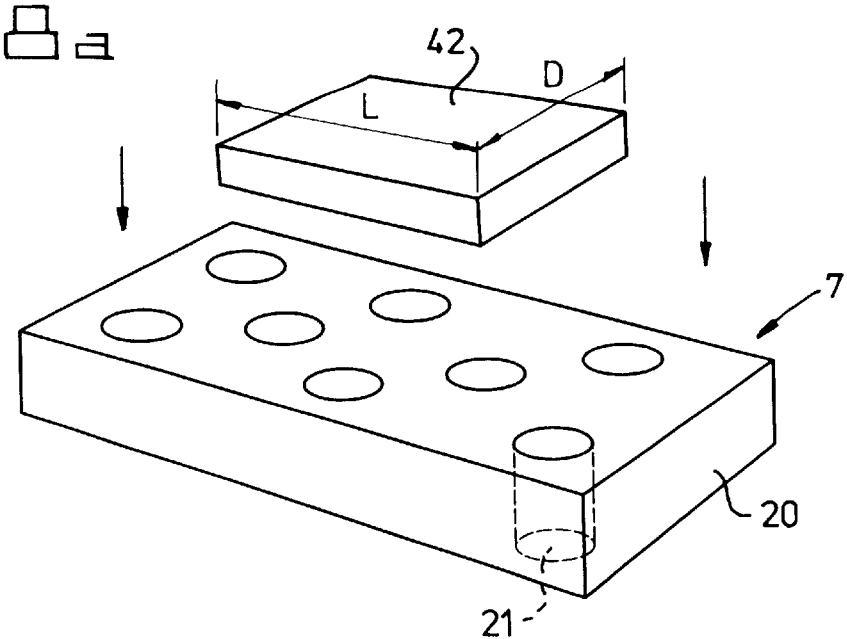
Figure 8B:
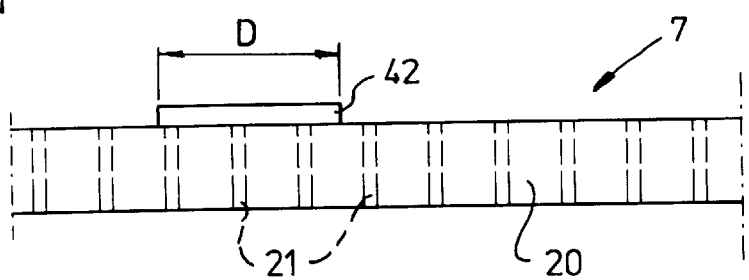
Figure 8C:
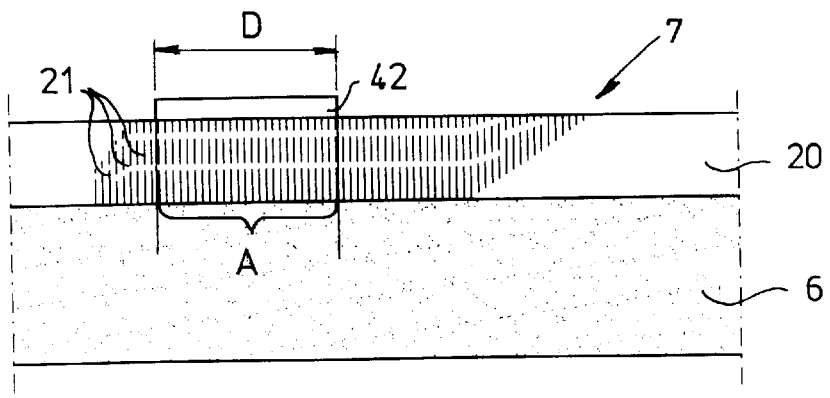
Figure 12:
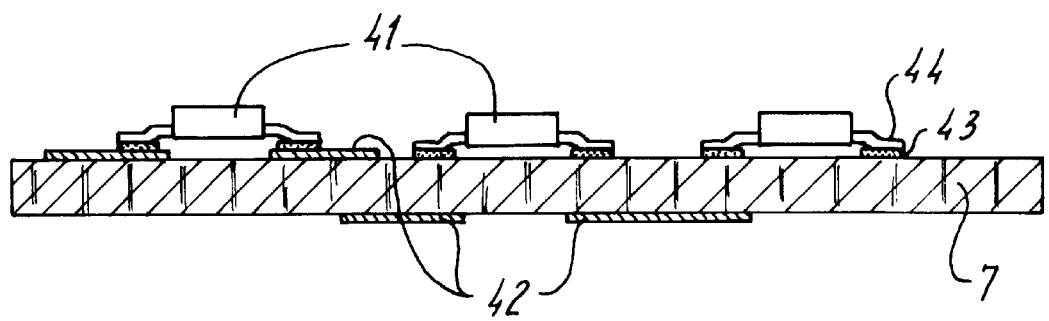

FIGS. 8a, 8b, and 8c show diagrammatically the structure of an electrode and a layer which is provided with a pattern of conductors, which conductors extend exclusively in a direction perpendicular to the surface of the layer;

FIGS. 9a, 9b, 9c, 10, and 11 inclusive show alternative methods for forming a layer such as that shown in FIGS. 8a–8c;

FIG. 12 shows the use of a layer as shown in FIGS. 8a–8c as printed circuit board (pcb).

Figure 3:
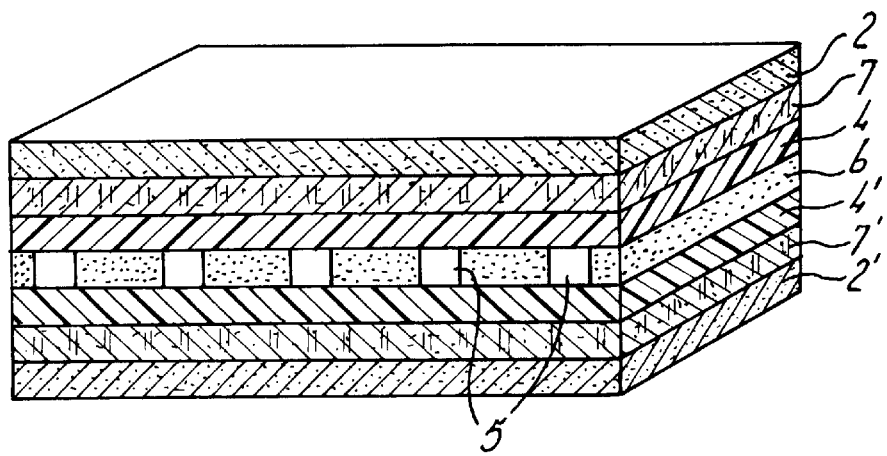
FIG. 3 shows an LCD having a layer structure according to the present invention.

FIG. 3 shows an LCD in accordance with the present invention. In the layer structure according to FIG. 3, the controlling layers 2, 2' have not been applied directly to the insulating layers 4, 4', but an additional layer 7, 7' is situated in between. Said additional layer is formed from a material in which there are conductors directed exclusively in a direction perpendicular to the surface of the layers 7, 7'. Such a layer 7 is shown diagrammatically in FIGS. 8a and 8b. The layer 7 is therefore composed of an insulating material 20 which contains small conducting channels 21 which extend exclusively in a direction perpendicular to the surface of the layer. Preferably, both the insulating layer 20 and the small conducting channels 21 are transparent. The cross section of the small channels 21 and the mutual spacing of the small channels 21 determine the resolution of the device in which the layer 7 is used.

FIG. 8a shows a perspective view of insulating layer 20 with channels 21, and an electrode 42 which is to be connected to the layer 20 at a predetermined location. FIG. 8b shows the electrode 42 at the predetermined location. The electrode 42 may have any desired shape. However, in accordance with the invention there is a relationship between the dimension of the electrode 42 and the mutual distance between adjacent channels 21 such that no matter where electrode 42 contacts layer 20 it will always contact at least one channel 21. This reduces alignment problems seriously.

Figure 1:
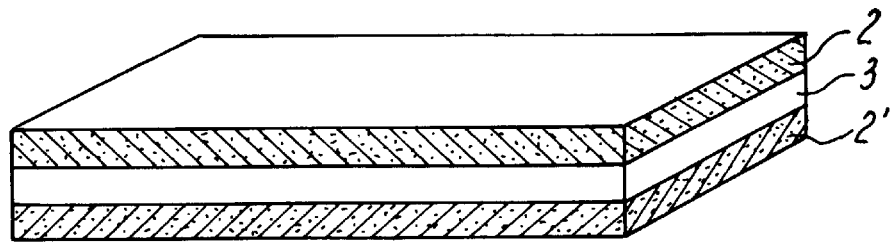
FIG. 1 shows a diagrammatic view of a conventional LCD.
Figure 2:
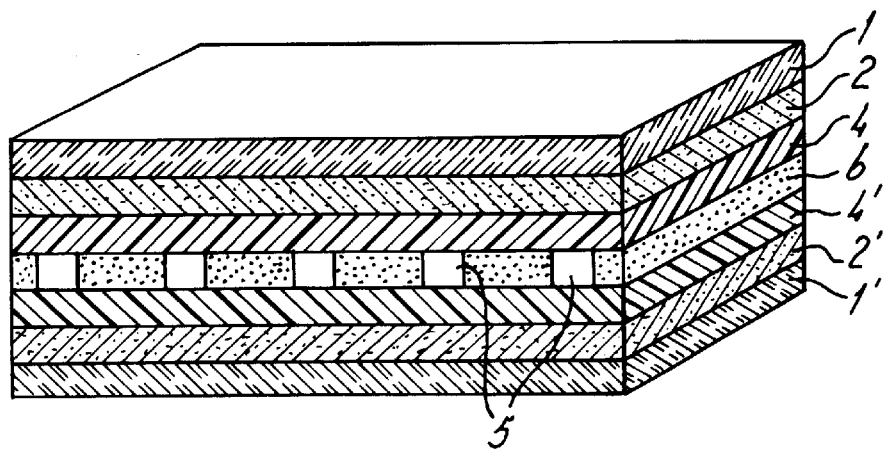
FIG. 2 shows the layer structure of a conventional LCD in greater detail.

In case electrode 42 has a rectangular shape, as shown in FIG. 8a, with width D and length L, L>D, this condition is met when the mutual distance between adjacent channels 21 is <D. To be sure that a good electrical contact between electrode 42 and at least one channel 21 will be established, preferably, that mutual distance is at most ½.D. Even more preferably, that mutual distance is at most ⅒.D In the arrangement according to FIG. 3, the layer 7 ensures support, which support was provided in the arrangement according to FIG. 2 by the layer 1. In other words, in the arrangement according to FIG. 3, the controlling layers 2, 2' are situated on the outside of the device. The controlling layers 2, 2' are therefore applied later than the insulating layers 4, 4'. The high temperatures occurring during the application of the insulating layers 4, 4' and the high electrostatic voltages occurring as a result of the "rubbing" procedure of the insulating layers 4, 4' therefore no longer have any influence on the controlling layers 2, 2'.

Electrodes of the conducting pattern inside the controlling layer 2 are connected to the small channels 21 inside the layer 7.

FIG. 8c further illustrates this. FIG. 8c shows a cross section through insulating layer 20 with conducting channels 21 above liquid-crystal layer 6. Here, the mutual distance between the channels 21 is much smaller than the dimension D of electrode 42. A voltage applied on electrode 42 will be transmitted, as it were, perpendicular in the direction of liquid-crystal layer 6 and be present at the terminating portions of the channels 21 at the interface between layer 7 and layer 6. Therefore, in an area indicated by "A" in FIG. 8c a plurality of channels present an electrical voltage to the liquid-crystal layer 6, thus forming a kind of virtual electrode. Therefore, there is no need to apply an additional electrode in area A to present the voltage to liquid-crystal layer 6. This facilitates the manufacturing process of liquid crystal display devices. Moreover, locations where voltages need to be presented to liquid-crystal layer 6 are only determined by the location of electrodes 42 on the outside surface of the layer 7, which facilitates achieving a desired resolution. The number of channels and there mutual distances, as well as the size of the electrodes 42 determine the resolution actually obtained.

The device according to FIG. 3 can be marketed without the presence of the controlling layers 2, 2'. Such a device thus comprises only the layers 7, 4, 6, 4', 7' and still has a universal possible application. Any user can apply the pattern of conductors he desires by means of the controlling layers 2, 2'.

It is also possible to market a structure in which only one of the layers 7, 7' is applied. The layer 7' is then, for example, absent. At the point where the layer 7' is situated, a user can apply a transparent conducting pattern according to his own design.

Figure 4:
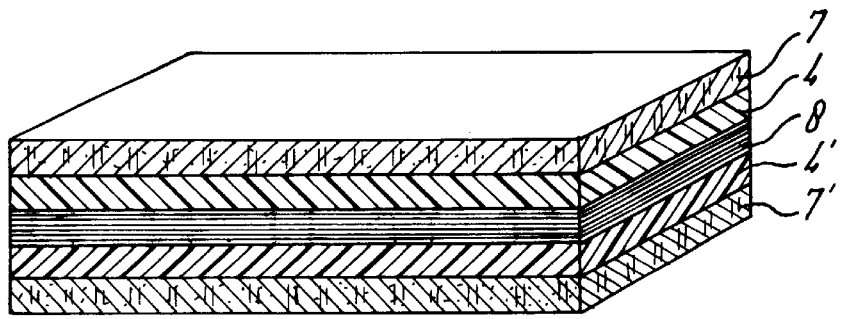
FIG. 4 shows an alternative structure for the layer structure of FIG. 3.

FIG. 4 shows an alternative to such an unfinished LCD structure. In place of the liquid-crystal layer 6 having spacers 5, the device according to FIG. 4 is provided with a polymer dispersed liquid-crystal layer 8.

It is obvious that one of the two layers 7, 7' can be replaced by a transparent, completely electrically conducting layer also in the arrangement according to FIG. 4.

The devices according to FIGS. 3 and 4, or the variants thereof indicated above, can be provided on one side thereof with a light-reflecting layer. This produces light-reflecting LCDs. Light-reflecting LCDs provide a more natural viewing characteristic, are less tiring and are superior to conventional viewing screens in the event of increase in the illumination level. Information presented by light-reflecting LCDs is also more readily absorbed by users than information presented by transparent LCDs and/or light-emitting LCDs.

Figure 5:
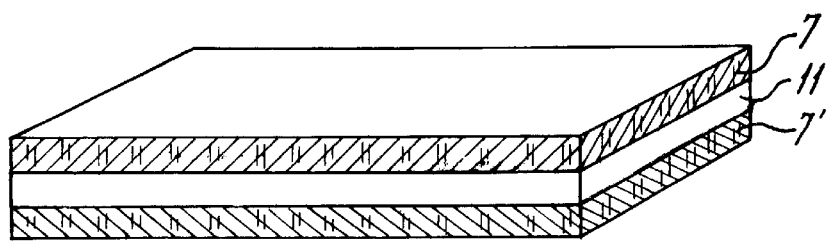
FIG. 5 shows the application of a light-emitting layer in the device according to the invention.

FIG. 5 shows a device according to the invention in which a light-emitting layer 11 is applied instead of a liquid-crystal layer 6 having spacers 5 or a liquid-crystal layer 8. Said light-emitting layer 11 has the property that it emits light at those locations at which an electrical voltage is applied perpendicularly to the surface of the light-emitting layer 11.

FIG. 5 again shows an unfinished basic structure. The basic structure can be completed by the customer by applying the controlling layers 2, 2' in the form he desires. One of the two layers 7, 7' can also be replaced if required by a layer which is completely transparent and is completely electrically conducting. As a further alternative, a light-reflecting layer can be applied to one of the two outsides of the layers 7, 7' so that the device according to FIG. 5 will emit light only on one side.

Figure 6A:
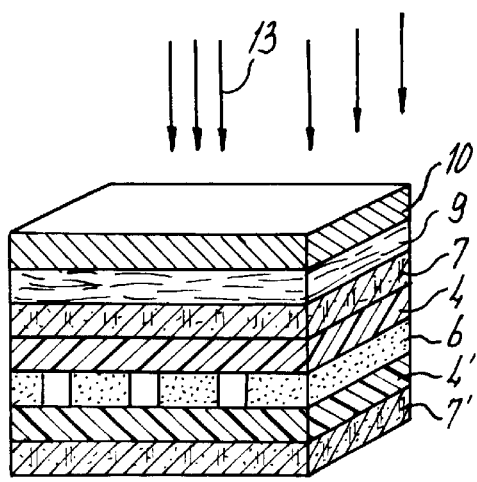
FIGS. 6a and 6b show alternative embodiments of a device according to the invention which can be used as electronic paper and also as laser-beam display.
Figure 6B:
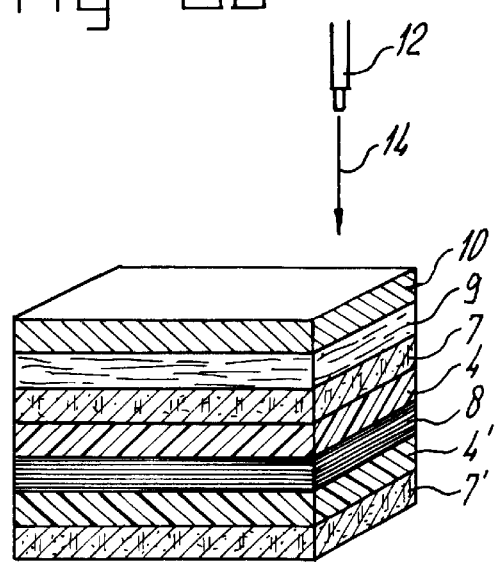

FIGS. 6a and 6b show devices which can be used as electronic paper or as laser-beam display.

The reference numerals in the device according to FIGS. 6a and 6b have the same meaning as in the preceding figures. A photosensitive layer 9 has been applied to the layer 7. A transparent, electrically conducting layer 10 is situated on the outside of the photosensitive layer 9.

The device according to FIG. 6a operates as follows. The device is exposed to light 13 which strikes the photosensitive layer 9 via the electrically conducting layer 10. At the points where light is incident on the photosensitive layer 9, the latter becomes conducting. At those points where no light is incident, the photosensitive layer 9 remains an insulator. At those points where light first falls and is interrupted, the insulating state returns. The electrical connections between the conductors 21 in the layer 7 and the electrically conducting layer 10 are thus defined, as it were, by means of the photosensitive layer 9. A desired pattern of the electric field in the liquid-display layer 6 can thus therefore also be defined by applying voltage to the electrically conducting layer 10 and the layer 7'. If the liquid-crystal layer 6 is of the smectic (ferroelectric) type, the image thus recorded will be retained because smectic LCDs have a memory function even if the voltage is switched off. If nematic LCDs are used, application of suitable electronics is necessary to achieve the memory function.

A light-reflecting layer can again be applied to the underside of the device according to FIG. 6a. Layer 7' itself may also be made of light-reflecting material. The layer 7' can be replaced by a layer which is completely electrically conducting and is optionally reflecting or transparent.

The transparent type can be used, for example, as a transparency which is used in the case of slides for overhead projectors.

The advantage of the "electronic paper" according to FIG. 6a is that the image recorded therein can be replaced by another image as a result of repeating the above-mentioned procedure.

FIG. 6b shows an alternative to the device according to FIG. 6a. The only difference between the layer structures according to FIGS. 6a and 6b is that, in FIG. 6b, a polymer dispersed liquid-crystal layer 8 is used instead of the liquid-crystal layer 6 having spacers 5.

Another difference between FIGS. 6a and 6b as a whole is that a laser 12 which emits a laser beam 14 in the direction of the photosensitive layer 9 is shown in FIG. 6b. Since the cross section of the laser beam 14 can be very restricted an image can be written very accurately in the photosensitive layer 9 with the laser 12. This benefits the total resolution. At those points where the laser beam strikes the photosensitive layer 9, the latter becomes conducting. At those points at which the laser beam is absent, the photosensitive layer 9 remains an insulator. Electronic paper can then be defined in the same way as in the device according to FIG. 6a.

It is pointed out that, in the devices according to FIGS. 6a and 6b, the layer 7 can in principle be omitted. The light beam 14 then makes a channel in the layer 9 with which an electrical voltage can be transmitted directly to the layer 4 without the intervention of layer 7.

An interesting application of the layer structure according to FIG. 6a or 6b with the laser 12 is that of a laser-beam display. The laser beam 14 which is generated by the laser 12 can specifically write an image composed of various image points in the photosensitive layer 9, which image points are sequentially transmitted to the liquid-crystal layer 6 or the polymer dispersed liquid-crystal layer 8 at the instant the voltage is applied between the layers 10 and 7'. Each image point can always be replaced by a subsequent image point by always writing an image point again in the photoconducting layer 9 with the aid of the laser beam 14 and then transferring it to the liquid-crystal layer 6 or the polymer dispersed liquid-crystal layer 8. The resolution of such a screen is particularly high and only restricted by the cross section of the small channels 21 in the layer 7 (or 7') and their mutual spacing.

A light-emitting layer 11 can again also be used instead of the liquid-crystal layer 6 with spacers 5 and the polymer dispersed liquid-crystal layer 8 (not shown). Such a light-emitting layer can emit light of one colour. As an alternative, however, said light-emitting layer may be constructed so that coloured images can be displayed, just as in the case of conventional coloured-image tubes.

The displays fabricated in this way have the same structure everywhere, as a result of which they are insensitive to variations in the positioning of the laser beam, which is not the case for conventional image tubes.

The resolution of such laser-beam displays is particularly high.

The devices according to FIGS. 6a and 6b can advantageously be used as mask in photolithographic processes. After all, a desired pattern of opaque and transparent portions can be defined in the liquid-crystal layer 6 or the polymer dispersed liquid-crystal layer 8 with the aid of the laser beam 14. If such a device whose pattern defined in this way in the liquid-crystal layer 6 or the polymer dispersed liquid-crystal layer 8 corresponds to the pattern of a certain photolithographic mask is placed above a semiconductor device provided with a photoresist layer, said photoresist layer can be exposed using a different light beam. Said different light beam will then transfer the pattern recorded in the layer 6 or 8 to the photoresist layer on the semiconductor. Said photoresist layer can then be developed and treated in a known manner. Structures can be transferred in this way to the semiconductor device using a mask which, in principle, does not have to change position. The pattern on the mask formed in this way can simply be altered by writing a new pattern in the photosensitive layer 9 using the laser beam 14 and transferring it to the layer 6, 8 by applying the correct voltage between the layers 10 and 7'. In this way, new masks do not always have to be used each time in subsequent photolithographic steps. After all, in the device a new mask can always be defined without altering the position of the latter. This benefits the accuracy.

FIG. 7 shows a device in which the reference numerals corresponding to the reference numerals in the preceding figures have the same meaning.

The device is provided with an underlayer 52 which is a photosensitive cover layer. A certain pattern of positions which are opaque or transparent to light 13 is recorded in the layer 6, 8 in the manner described above. The light 13 then exposes the photosensitive cover layer 52 only at those points where the layer 6, 8 is transparent. As a result a copy of the pattern in the layer 6, 8 is produced on the photosensitive cover layer 52. The photosensitive cover layer 52 can then be developed in a known chemical way so that a copy of the image is produced.

The unexposed portions of the cover layer 52 can be removed with the aid of selective etching procedures. As will be clear to a person skilled in the art, as a specific alternative the exposed portion of the cover layer 52 can be removed with the aid of selective etching procedures.

One or more coloured layers can also be applied as desired to the points where the layer 52 has been removed. Furthermore, metal/insulator/metal structures, thin-film transistors, diodes and/or conductors can be applied in this way.

It is pointed out that the layer 7 can in principle also be omitted in the structure according to FIG. 7.

Figure 9A:
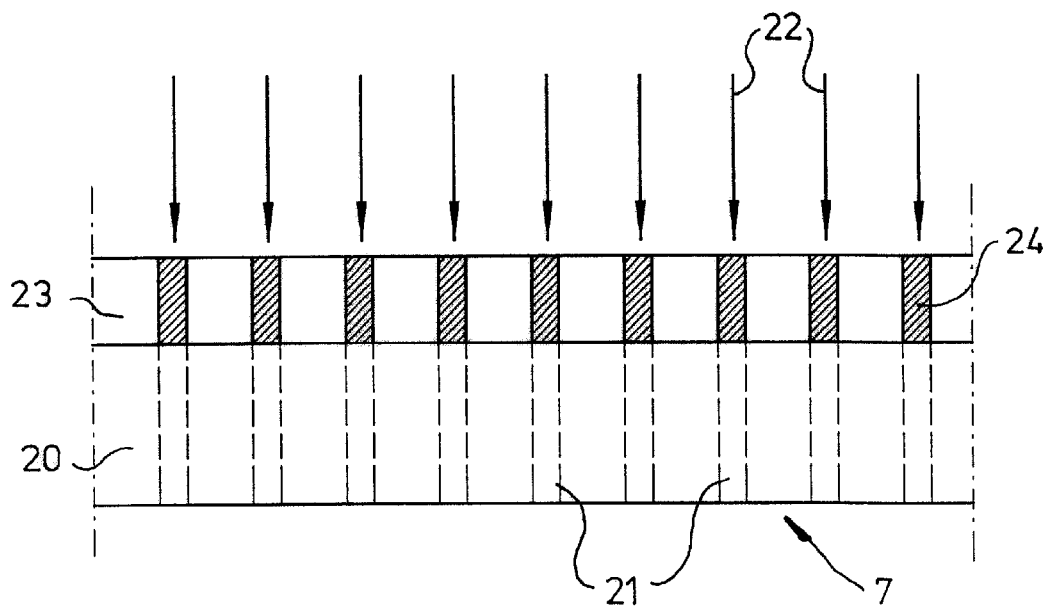
Figure 9B:
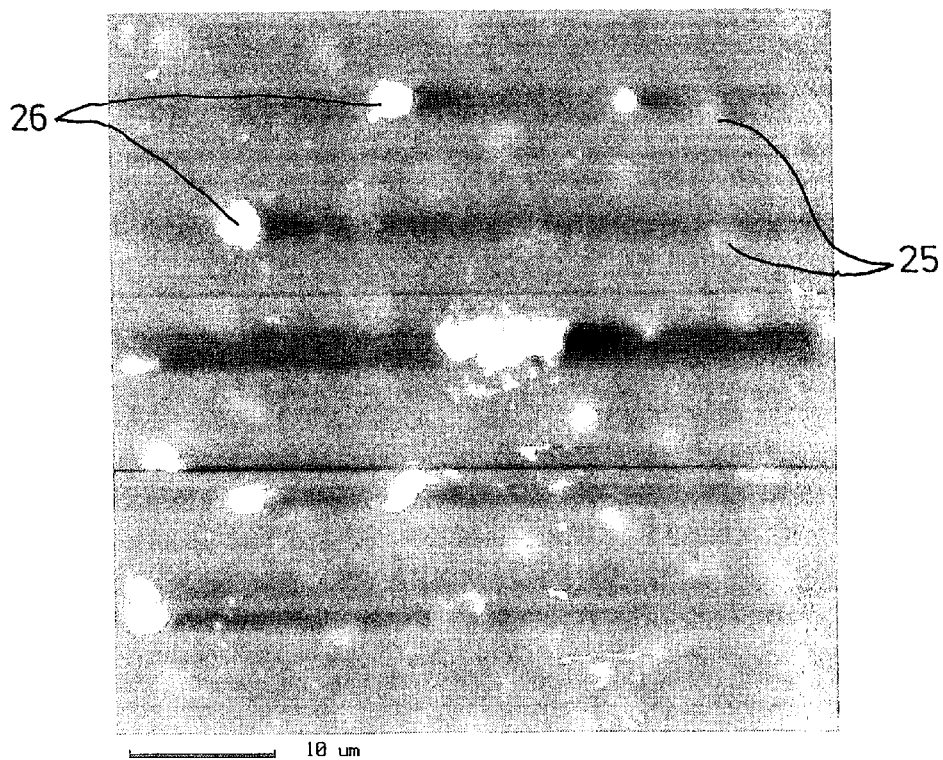

FIGS. 9a and 9b show a possible method for manufacturing a layer, as shown in FIGS. 8a–8c.

There is provided a layer 7 from a material which has a predetermined starting conductivity. However, the conductivity of the selected material can be changed substantially by illuminating the material with radiation of a predetermined wave length.

In a first step a mask 23 is provided on the layer 7. The mask 23 is provided with a plurality of portions 24 which are non-transparent to radiation of that predetermined wave length. Then, the mask 23 and the layer 7 are illuminated with radiation 22 having that predetermined wave length. The radiation 22 is directed to the mask substantially perpendicular to its surface.

Those portions of the layer 7 which are illuminated by radiation 22 will obtain a substantial lower conductivity than the starting conductivity whereas those portions, indicated with reference sign 21, which are not illuminated will retain the starting conductivity. Thus, by providing the portions 24 in the mask 23 with the proper size and proper mutual spacings, a desired pattern of conducting channels 21 in layer 7, having a desired channel width and mutual spacings, can be made.

In a first example, pure PANi/CSA (camphor sulphonic acid) films were used as layer 7. Different films of PANi/CSA were exposed to 1, 2, and 14 hours respectively, to UV light 22. The starting films had a conductivity of ±40 S/cm. The films were exposed for 1, 2, and 14 hours, respectively, and showed conductivities of 3, 1, and $10^{-4}$ S/cm, respectively. The conductivity of the films was measured using a two-probe method.

This shows that a reasonably high anisotropy in conductivity can be obtained by UV exposure. Probably, the PANi/CSA is partially transformed by the UV light to non-conducting emeraldine base.

A test layer 7 was also made in which the portions 24 were transparent to UV light 22 whereas the remaining portion of mask 23 was non-transparent to the UV light 22. Thus, in this experiment the channels 21 became non-conducting. The sample thus obtained was checked on the appearance of topological changes (caused by ablation), both by AFM and SEM. The SEM measurements, conducted without gold coating, did not show topological irregularities, giving an indication that no significant ablation occurred. However, the AFM measurements showed small topological changes. These changes are shown in FIG. 9b, which shows an AFM image (contact measurement) of an area of a PANi/CSA film exposed to UV light for 14 hours through a mask comprising holes with diameters of ±1 micrometer at mutual distances of 3.5 micrometer.

Small dots 25, having light grey colour in FIG. 9b, with approximately the diameter of the mask holes are visible in FIG. 9b, having an average height of 50–100 nanometer, which is most probably due to heat-induced surface swelling. Why this was not observed in the SEM measurements is not clear at the moment. Most probably, the absence of a thin gold coating (to provide conductivity) on top of the sample resulted in poor imaging of the non-conducting phase. The large white spots 26 in FIG. 9b are due to glass particles stemming from a diamond cutter used for cutting to make the sample fit on an AFM sample holder.

A second experiment was conducted with so-called ORMECON® lacquer of Zipperling. This complicated lacquer system is based on a dispersion of PANi/DBSA (DodecylBenzeneSulphonicAcid) in, most probably, p-xylene and other cosolvents. A thin film of the lacquer was spincasted at a rotation speed of 3500 rpm on a glass plate. This resulted in a green film with a thickness of approximately 100 micrometer and a resistance of 7 kΩ. Measurement was done with a simple voltmeter and two point probes. A film could be easily peeled of the glass surface and had good mechanical properties. The film was exposed to UV light for approximately 1.5 hour, resulting in a colour change from green to black/blue. No surface resistance could be measured with the simple voltmeter indicating that the conductivity was seriously diminished, i.e., resistance>20 MΩ. Conductivity measurements with evaporated gold contacts are scheduled to provide exact conductivity values.

Figure 9C:
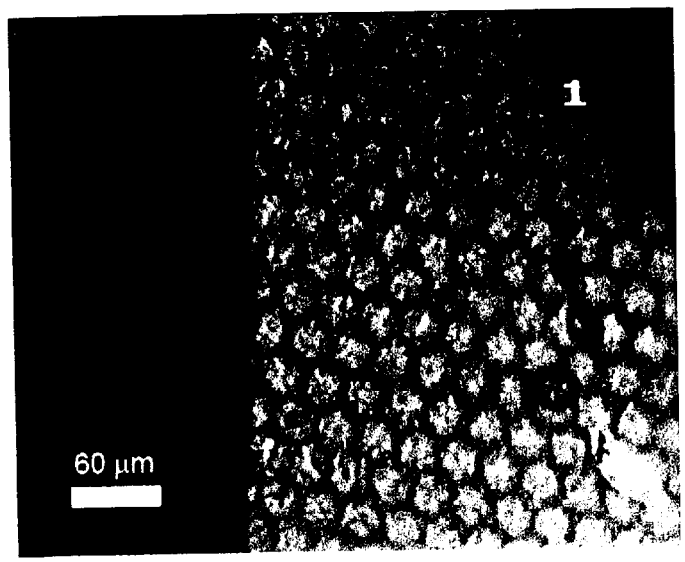

A third experiment was also conducted with ORMECON® lacquer. A structure similar to the structure of FIG. 3 was made in the following way. A thin electrode was applied to a glass substrate. On the thin (aluminium) electrode a layer of ORMECON® lacquer was applied, the ORMECON® lacquer being patterned in a way indicated in the preceding paragraph. On this ORMECON® lacquer layer a layer with spacers and polymer dispersed liquid-crystal was applied. An ITO was applied on the last layer. Finally, a glass layer was applied to the ITO layer. By means of an optical microscope an image of the arrangement thus obtained was made. FIG. 9c shows the result. FIG. 9c shows a pattern of conducting channels (light grey colour) surrounded by an isolating material (dark grey colour).

The above-mentioned preliminary results point out that for the lacquer the nonconductive PANi state is formed much more efficient than for PANi/CSA. The most important difference between the lacquer and PANi/CSA is the fact that in the lacquer DBSA is used as the dopant. Most probably, the UV light 22 destructs or evaporates the dopant and creates the non-conducting emeraldine base, rather than destroying the conductive polymer itself.

The intensity of the UV light 22 used was about 40 mW/cm$^2$.

Figure 10:
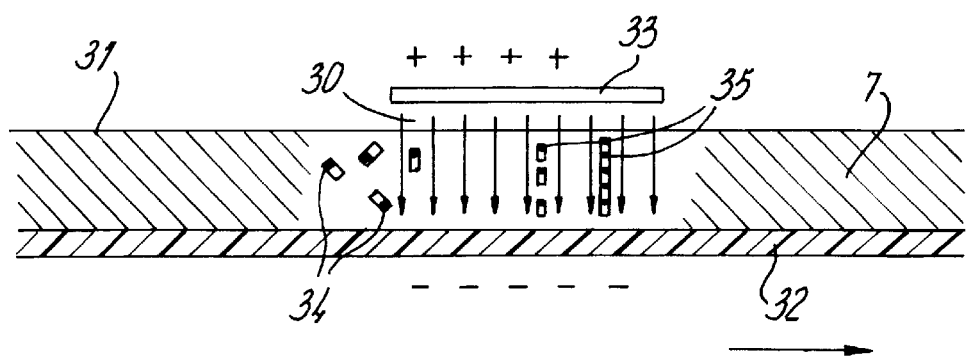

FIG. 10 shows an alternative method of forming a layer 7.

A mixture of matrix material provided with a solvent and a conductor additive 34 is applied to a substrate 32. At the beginning of the method, the mixture is still in liquid form.

The matrix material may, for example, be polycarbonate. However, the invention is not limited thereto. The conductor additive 34 may, for example, be a tetraselenotetracene complex (TSeT). However, other materials are also possible for this purpose.

A sheet is formed by pouring ("casting") the liquid onto the substrate 32. An electrical field perpendicular to the surface of the substrate 32 is generated at a predetermined position using a capacitor plate 33 opposite the conducting substrate 32. The substrate 32 is moved as indicated by an arrow in FIG. 10 so that the liquid matrix material 31 is introduced into the electrical field.

The solvent in the matrix material 31 will then evaporate, as a result of which the structure will become hard. Instead of spontaneous curing, forced curing can also be used, for example with the aid of ultraviolet light. Two-component curing can also be used.

In the liquid matrix material 31, there are produced conducting particles of the additive 34 which, under the influence of the generated electrical field 30, acquire a positive charge at that side which is closest to the negative side of the electrical field and a negative charge at that side which is closest to the positive side of the electric field. As a result, the particles 34 orient themselves and they form long chains 35 of head-to-tail bonds. Said chains will extend parallel to the electrical field as a result of the electrical field 30 present. A regular intermediate spacing between the chains 35 will, in addition, be produced as a result of the mutual repulsion of said chains. This results finally in a large number of parallel conductors which have no mutual connections so that channels 21 (see FIG. 8) are produced in the layer. On the substrate 32 there is produced in this way the desired layer 7 which can be removed from the carrier 32 with the aid of any known procedure. The distance between the chains 35 is dependent on the mixing ratio between the matrix material and the conductor additive. The cross section of the chains 35 which are ultimately formed and which form the small channels 21 depends on the conductor additive chosen. Since the chains are formed at molecular level, the cross section can, however, be particularly small. The mutual spacings can also be made very small, which will increase the resolution of devices equipped therewith. If the cross section of the chains 35 and their mutual spacings are very small, it is of less importance whether all the chains 35 are formed completely correctly, i.e. whether they are all completely conducting. A small percentage of failures can be accepted because many chains grouped together next to one another will nevertheless be used for the ultimate applications. A pixel (image point) defined by conductor pattern 2, 2' on top of the layer 7 in, for example, the embodiment of FIG. 3 will in practice be transmitted to the liquid-crystal layer 6 by many parallel chains 35.

Figure 11:
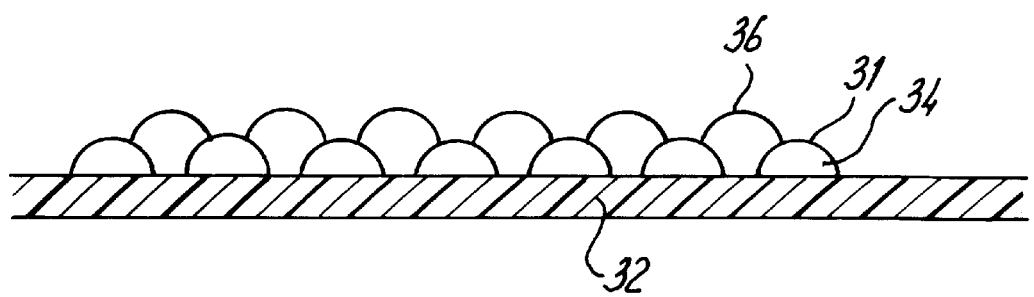

FIG. 11 shows a third method of making a layer 7. A pattern of a liquid composed of a matrix material containing solvent and a conductor additive 34 is printed on a substrate 32 at predetermined points. The materials used for this purpose may be the same as mentioned above with reference to FIG. 10. Dots are printed in this way at a minimum distance from one another and with a minimum cross section. The dots are dried by the evaporation of the solvent. In this process, for example, additional heat may be supplied. After drying, the dots are completely conducting. In this case, no use is therefore made of an external electrical field.

The gap between the dots is then filled with an insulating material 36. Polycarbonate, for example, can be used for this purpose. This can also be done using known printing procedures. Said insulating material is then also dried. The desired layer 7, which can be removed from the carrier 32 with the aid of any known procedure, is produced in this way on the substrate 32. The method in accordance with FIG. 11, too, allows the cross sections of the channels 21 and their mutual spacing to be made very small.

The layer 7 obtained by the methods outlined above can be used not only for the devices described above. If the layer 7 is sufficiently thick, it is rigid enough to be treated separately and, as shown in FIG. 12, it can also be used, for example, as substrate for electronic components, such as chips 41. Such components can then be applied to either side of the substrate and mutually interconnected at desired positions by means of the small conducting channels 21 and conductor patterns 42 applied to the substrate. Chips 41 with their terminals 43 can be mounted on the layer 7 or on the conductor patterns 42 by means of a conducting paste which cures after application.

It will be clear to the person skilled in the art that the description given above is given only by way of example and that the scope of protection of the invention is limited only by the definition of the claims.

What is claimed is:

1. Device for displaying information, comprising at least:
   a first layer which extends in one plane and is composed of a material whose optical properties vary under the influence of an external electrical control system in such a way that either the transparency of portions selected with the electrical control system of the first layer for light incident thereon varies or portions selected with the electrical control system of the first layer emit light;

a second and a third layer which extend substantially parallel to the plane, are situated on either side of the first layer and impart to the device a certain desired rigidity, at least one of the second and third layers having a first conductivity and being provided with at least one electrode and with electrically conducting channels which are extending exclusively in a direction perpendicular to the plane, said channels having a second conductivity substantially larger than the first conductivity, said at least one electrode electrically contacting at least one of said channels, wherein said at least one electrode has a minimum dimension (D) in a contact area with said at least one of the second and third layers, mutual distances between at least some adjacent ones of the plurality of channels being smaller than said minimum dimension (D) of said at least one electrode, and wherein maximum mutual distances between all adjacent ones of the plurality of channels are smaller than said minimum distance (D) of said at least one electrode.

2. Device according to claim 1, characterized in that the first layer is a liquid-crystal layer provided with spacers and in that a fourth layer which is made of an electrically insulating material is situated between one of the second and third layers mentioned and the first layer.

3. Device according to claim 1, characterized in that the first layer is a polymer dispersed liquid-crystal layer and in that a fourth layer which is made of an electrically insulating material is situated between one of the second and third layers mentioned and the first layer.

4. Device according to claim 1, characterized in that the first layer is a layer which emits light under the influence of an electrical current.

5. Device according to claim 1 inclusive, characterized in that there is applied to one of the second and third layers mentioned an eighth layer which is made of a photoconducting material, and there is applied to the eighth layer a ninth layer which is made of a transparent, electrically conducting material.

6. Device according to claim 5, characterized in that the other layer of said second and third layers is provided with electrical conductors extending exclusively in a direction perpendicular to the plane.

7. Device according to claim 6, characterized in that a sixth layer which is made of an electrically insulating material is situated between the other layer of the second and third layers mentioned and the first layer.

8. Device according to claim 5, further comprising a light source for generating a light beam for exposing locations of the eight layer.

9. Device according to claim 1 characterized in that a light-sensitive layer is applied on the side of the device where the other layer of the second and third layers is located.

10. Method of manufacturing a device for displaying information, comprising at least:

a first layer which extends in one plane and is composed of a material whose optical properties vary under the influence of an external electrical control system in such a way that either the transparency of portions selected with the electrical control system of the first layer for light incident thereon varies or portions selected with the electrical control system of the first layer emit light;

a second and a third layer which extend substantially parallel to the plane, are situated on either side of the first layer and impart to the device a certain desired rigidity, at least one of the second and third layers having a first conductivity and being provided with at least one electrode and with electrically conducting channels which are extending exclusively in a direction perpendicular to the plane, said channels having a second conductivity substantially larger than the first conductivity, said at least one electrode electrically contacting at least one of said channels, wherein said at least one electrode has a minimum dimension (D) in a contact area with said at least one of the second and third layers, mutual distances between at least some adjacent ones of the plurality of channels being smaller than said minimum dimension (D) of said at least one electrode and wherein a maximum mutual distance between all adjacent ones of the plurality of channels are smaller than said minimum distance (D) of said at least one electrode, the method comprising the following steps:

a. selecting said at least one of the second and third layers from a material which has a predetermined original conductivity but which can be changed substantially by illuminating it with radiation of a predetermined wavelength;

b. providing a mask on said at least one of the second and third layers, said mask being provided with a plurality of portions non-transparent to radiation of said predetermined wavelength, the spacings between the plurality of portions corresponding to the mutual distances between adjacent ones of the plurality of channels;

c. illuminating said mask with radiation of said predetermined wavelength;

d. terminating said illumination and removing said mask;

e. attaching said layer to the first layer.

11. Method according to claim 10 wherein said material comprises either PANi/CSA or PANi/DBSA.

12. Method of manufacturing a device for displaying information, comprising at least:

a first layer which extends in one plane and is composed of a material whose optical properties vary under the influence of an external electrical control system in such a way that either the transparency of portions selected with the electrical control system of the first layer for light incident thereon varies or portions selected with the electrical control system of the first layer emit light;

a second and a third layer which extend substantially parallel to the plane, are situated on either side of the first layer and impart to the device a certain desired rigidity, at least one of the second and third layers having a first conductivity and being provided with at least one electrode and with electrically conducting channels which are extending exclusively in a direction perpendicular to the plane, said channels having a second conductivity substantially larger than the first conductivity, said at least one electrode electrically contacting at least one of said channels, wherein said at least one electrode has a minimum dimension (D) in a contact area with said at least one of the second and third layers, mutual distances between at least some adjacent ones of the plurality of channels being smaller than said minimum dimension (D) of said at least one electrode, and wherein a maximum mutual distance between all adjacent ones of the plurality of channels are smaller than said minimum distance (D) of said at least one electrode, the method comprising the following steps:

a. applying a matrix material containing solvent and a conductor additive to a substrate;

b. applying an electrical field perpendicular to the substrate and evaporating the solvent at least virtually simultaneously so that the matrix material acquires a solid structure and the semiconductor additive forms conducting molecular structures in a direction at least virtually parallel to the electrical field;

c. removing the substrate;

d. attaching the solid structure and the semiconductor additive to the first layer.

13. Method of manufacturing a device for displaying information, comprising at least:

a first layer which extends in one plane and is composed of a material whose optical properties vary under the influence of an external electrical control system in such a way that either the transparency of portions selected with the electrical control system of the first layer for light incident thereon varies or portions selected with the electrical control system of the first layer emit light;

a second and a third layer which extend substantially parallel to the plane, are situated on either side of the first layer and impart to the device a certain desired rigidity, at least one of the second and third layers having a first conductivity and being provided with at least one electrode and with electrically conducting channels which are extending exclusively in a direction perpendicular to the plane, said channels having a second conductivity substantially larger than the first conductivity, said at least one electrode electrically contacting at least one of said channels, wherein said at least one electrode has a minimum dimension (D) in a contact area with said at least one of the second and third layers, mutual distances between at least some adjacent ones of the plurality of channels being smaller than said minimum dimension (D) of said at least one electrode, and wherein a maximum mutual distance between all adjacent ones of the plurality of channels are smaller than said minimum distance (D) of said at least one electrode, the method comprising the following steps:

a. printing a matrix material containing solvent and a conductor additive at predetermined locations of a substrate;

b. evaporating the solvent so that the matrix material acquires an electrically conducting, solid structure;

c. printing insulation material containing a further solvent on the substrate at locations situated outside the predetermined locations;

d. evaporating the further solvent so that the insulation material acquires an electrically conducting, solid structure;

e. removing the substrate;

f. attaching the insulation material and the matrix material with conductor additive to the first layer.

14. A display element, comprising:

a first layer comprising a material whose optical properties can be controlled by application of an electrical field;

second and third conductor layers arranged on opposite sides of the first layer so that an inner surface of each of the conductor layers is in contact with the first layer, each of the conductor layers being generally planar and generally parallel to the first layer, each of the second and third layers comprising a plurality of electrically conducting channels arranged in an insulating material, each of the electrically conducting channels being arranged generally perpendicular to the first layer and extending from the inner surface to an opposite outer surface of said conductor layer;

a plurality of contacts arranged on the outer surfaces of the conductor layers, each of the contacts being in electrical contact with a plurality of the electrically conducting channels;

wherein the contacts are arranged so that application of voltages to the contacts on opposite sides of the display element results in the voltages being applied to the first layer through the electrically conducting channels so as to control the optical properties of portions of the first layer between the contacts.

15. The display element of claim 14, wherein there are a plurality of the contacts arranged on each of the outer surfaces.

* * * * *